(12) United States Patent
Yamaguchi (10) Patent No.: US 11,876,545 B2
(45) Date of Patent: Jan. 16, 2024

(54) RADIO-FREQUENCY MODULE AND COMMUNICATION DEVICE

(71) Applicant: Murata Manufacturing Co., Ltd., Nagaokakyo (JP)

(72) Inventor: Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/468,670

(22) Filed: Sep. 8, 2021

(65) Prior Publication Data
US 2021/0409046 A1 Dec. 30, 2021

Related U.S. Application Data

(63) Continuation of application No. PCT/JP2020/010517, filed on Mar. 11, 2020.

(30) Foreign Application Priority Data

Mar. 13, 2019 (JP) .................................. 2019-046286

(51) Int. Cl.
*H04B 1/08* (2006.01)
*H04B 1/10* (2006.01)
(Continued)

(52) U.S. Cl.
CPC ............. *H04B 1/08* (2013.01); *H04B 1/1018* (2013.01); *H04B 1/1615* (2013.01); *H04B 1/18* (2013.01)

(58) Field of Classification Search
CPC ............... H03F 2200/451; H03F 3/245; H03F 2200/294; H03F 1/565; H03F 3/24;
(Continued)

(56) References Cited

U.S. PATENT DOCUMENTS

| 9,887,727 | B1* | 2/2018 | Yokoyama | ............... H04B 1/44 |
| 2014/0055956 | A1* | 2/2014 | Nakamura | ............... H04B 1/44 |
| | | | | 361/748 |

(Continued)

FOREIGN PATENT DOCUMENTS

| JP | 2005-79885 A | 3/2005 |
| JP | 2006-203652 A | 8/2006 |

(Continued)

OTHER PUBLICATIONS

Written Opinion of the International Searching Authority dated Apr. 28, 2020, received for PCT Application PCT/JP2020/010517, Filed on Mar. 11, 2020, 6 pages. (Previously filed; submitting English translation only.).

(Continued)

*Primary Examiner* — Golam Sorowar
(74) *Attorney, Agent, or Firm* — XSENSUS LLP (57) ABSTRACT

A radio-frequency module includes a mounting board having first and second major surfaces opposite to each other and a duplexer including a transmit filter coupled to a node and a receive filter coupled to the node. The transmit filter is mounted on the first major surface, and the receive filter is mounted on the second major surface. When the mounting board is viewed in a plan view, a footprint of the transmit filter at least partially overlaps a footprint of the receive filter.

18 Claims, 3 Drawing Sheets

(51) Int. Cl.
*H04B 1/16* (2006.01)
*H04B 1/18* (2006.01)

(58) Field of Classification Search
CPC . H03F 3/72; H03F 3/195; H03F 3/193; H03F 3/211; H03F 2200/111; H03F 1/223; H03F 2200/171; H03F 2200/222; H03F 1/0227; H03F 1/3205; H03F 2203/7209; H03F 1/32; H03F 1/0288; H03F 3/191; H03F 1/0277; H03F 2200/387; H03F 1/0205; H03F 2200/102; H03F 2200/105; H03F 2203/21109; H03F 2203/21157; H03F 3/68; H03F 1/347; H03F 3/19; H03F 2200/534; H04B 1/525; H04B 1/0057; H04B 1/40; H04B 1/44; H04B 1/0458; H04B 1/48; H04B 2001/0408; H04B 1/006; H04B 1/0064; H04B 1/18; H04B 1/0475; H04B 2001/485; H04B 15/00; H04B 1/005; H04B 1/0483; H04B 2001/0433; H04B 1/406; H04B 1/52; H04B 1/58; H04B 7/0602; H04B 1/04; H04B 1/109; H04B 7/04; H04B 7/0817; H04B 1/16; H04B 1/3805; H04B 15/02; H04B 2001/0416; H04B 2201/70724; H04B 17/11; H04B 17/14; H04B 2001/045; H03H 9/725; H03H 7/463; H03H 9/706; H03H 9/0566; H03H 9/70; H03H 7/38; H03H 9/0576; H03H 11/344; H03H 2001/0085; H03H 7/465; H03H 9/08; H03H 9/6483; H03H 2210/025; H03H 7/0115; H03H 9/0571; H03H 9/54; H03H 1/0007; H03H 11/348; H03H 2007/013; H03H 9/0561; H03H 2007/386; H03H 2210/012; H03H 2210/033; H03H 7/0153; H03H 9/6433; H03H 7/0161; H03H 7/175; H03H 7/1758; H03H 7/1766; H03H 7/1775

See application file for complete search history.

(56) References Cited

U.S. PATENT DOCUMENTS

2017/0133998 A1* 5/2017 Hino ................. H03H 9/46
2017/0353173 A1* 12/2017 Sakurai ............. H03H 9/059

FOREIGN PATENT DOCUMENTS

| JP | 2011-40602 A | 2/2011 |
| JP | 2014-512116 A | 5/2014 |
| JP | 2015-103888 A | 6/2015 |
| WO | 2019/054154 A1 | 3/2019 |

OTHER PUBLICATIONS

International Search Report and Written Opinion dated Apr. 28, 2020, received for PCT Application PCT/JP2020/010517, Filed on Mar. 11, 2020, 9 pages including English Translation.

* cited by examiner

RADIO-FREQUENCY MODULE AND COMMUNICATION DEVICE

CROSS-REFERENCE TO RELATED APPLICATIONS

The present application is a continuation of and claims priority to PCT/JP2020/010517, filed Mar. 11, 2020, which claims priority to JP 2019-046286, filed Mar. 13, 2019, the entire contents of each are incorporated herein by its reference.

TECHNICAL FIELD

The present disclosure relates to a radio-frequency module and a communication device including the radio-frequency module.

BACKGROUND ART

In mobile communication devices, such as mobile phones, particularly along with the development of multiband communication, circuit elements constituting a radio-frequency front-end circuit has increased, which makes it difficult to miniaturize a radio-frequency module.

Patent Document 1 discloses a semiconductor module miniaturized by using a wiring board having surfaces on both of which components can be mounted. Specifically, a transmit circuit, which is constituted by a power amplification device (power amplifier) and a transmit filter, and a receive circuit, which is constituted by a low-noise amplification device (low-noise amplifier) and a receive filter, are coupled between an antenna switch and a radio frequency integrated circuit.

CITATION LIST

Patent Document
Patent Document 1: Japanese Unexamined Patent Application Publication No. 2011-040602

SUMMARY

Technical Problem

In the semiconductor module disclosed in Patent Document 1, the transmit filter and the receive filter are mounted on an identical major surface of the wiring board.

However, when an output end of the transmit filter and an input end of the receive filter are coupled to a common terminal such that the transmit filter and the receive filter form a multiplexer (including a duplexer), if the interconnection length from the common terminal to the transmit filter and the interconnection length from the common terminal to the receive filter are relatively long, interconnect resistance and phase shifts cause increased signal communication loss. When the transmit filter and the receive filter are mounted on the identical major surface, if the interconnection length is shortened to reduce signal communication loss, the transmit filter and the receive filter are positioned in close proximity to each other at the same major surface, which worsens isolation between transmit signals and receive signals.

The present disclosure has been made to address the problems described above, and one object of the present disclosure is to provide a radio-frequency module and a communication device that include a multiplexer constituted by a transmit filter and a receive filter and that can reduce signal communication loss and also improve isolation between transmission and reception.

Solution to Problem

To achieve the object described above, a radio-frequency module according to an aspect of the present disclosure includes a mounting board having a first major surface and a second major surface opposite to each other and a multiplexer including a first common terminal, a transmit filter coupled to the first common terminal, and a receive filter coupled to the first common terminal. The transmit filter is mounted on the first major surface. The receive filter is mounted on the second major surface. When the mounting board is viewed in plan view, a footprint of the transmit filter at least partially overlaps a footprint of the receive filter.

Advantageous Effects

The present disclosure provides the radio-frequency module and a communication device to that include a multiplexer constituted by a transmit filter and a receive filter and that can reduce signal communication loss and also improve isolation between transmission and reception.

DESCRIPTION OF EMBODIMENTS

Hereinafter, an embodiment of the present invention will be described in detail with reference to the drawings. It should be noted that the embodiment described below is a specific or comprehensive instance. Specifics including numerical values, shapes, materials, constituent elements, arrangements of the constituent elements, and modes of connection given in the following embodiment are mere instances and are not intended to limit the present disclosure. Among the constituent elements in the following embodiment, constituent elements not recited in any of the independent claims are described as arbitrary constituent elements.

The drawings are schematically illustrated with appropriate accentuation, omission, or proportion adjustment to depict the present disclosure and are not necessarily illustrated in an exact manner; therefore, the shape, positional relationship, and proportion may be different from actual ones. Like reference symbols are used to denote substantially like configurations in the drawings, and redundant descriptions thereof may be omitted or simplified.

In the drawings described later, the X axis and the Y axis are axes perpendicular to each other in a plane parallel to major surfaces of a mounting board. The Z axis is an axis perpendicular to major surfaces of a module substrate; the forward direction of the Z axis indicates an upward direction, and the reverse direction of the Z axis indicates a downward direction.

In the present disclosure, the expression "coupled" includes not only the case in which a circuit element is directly coupled to another circuit element by using a connection terminal and/or a wiring conductor but also the case in which a circuit element is electrically coupled to another circuit element via a passive element such as an inductor or capacitor.

In the present disclosure, words used to express relationships between elements, such as parallel and vertical, words used to express the shape of an element, such as rectangular, and numerical ranges do not necessarily denote the exact meanings but denote substantially the same meanings involving, for example, several percent differences.

In the present disclosure, the expression "plan view" denotes that an object is projected on an XY plane in the Z direction and viewed.

Embodiment

An embodiment will be described with reference to FIGS. 1 to 3.

[1 Circuit Configuration of Radio-Frequency Module 1 and Communication Device 5]

Firstly, a circuit configuration of a radio-frequency module 1 and a communication device 5 according to the present embodiment will be specifically described with reference to FIG. 1.

Figure 1:
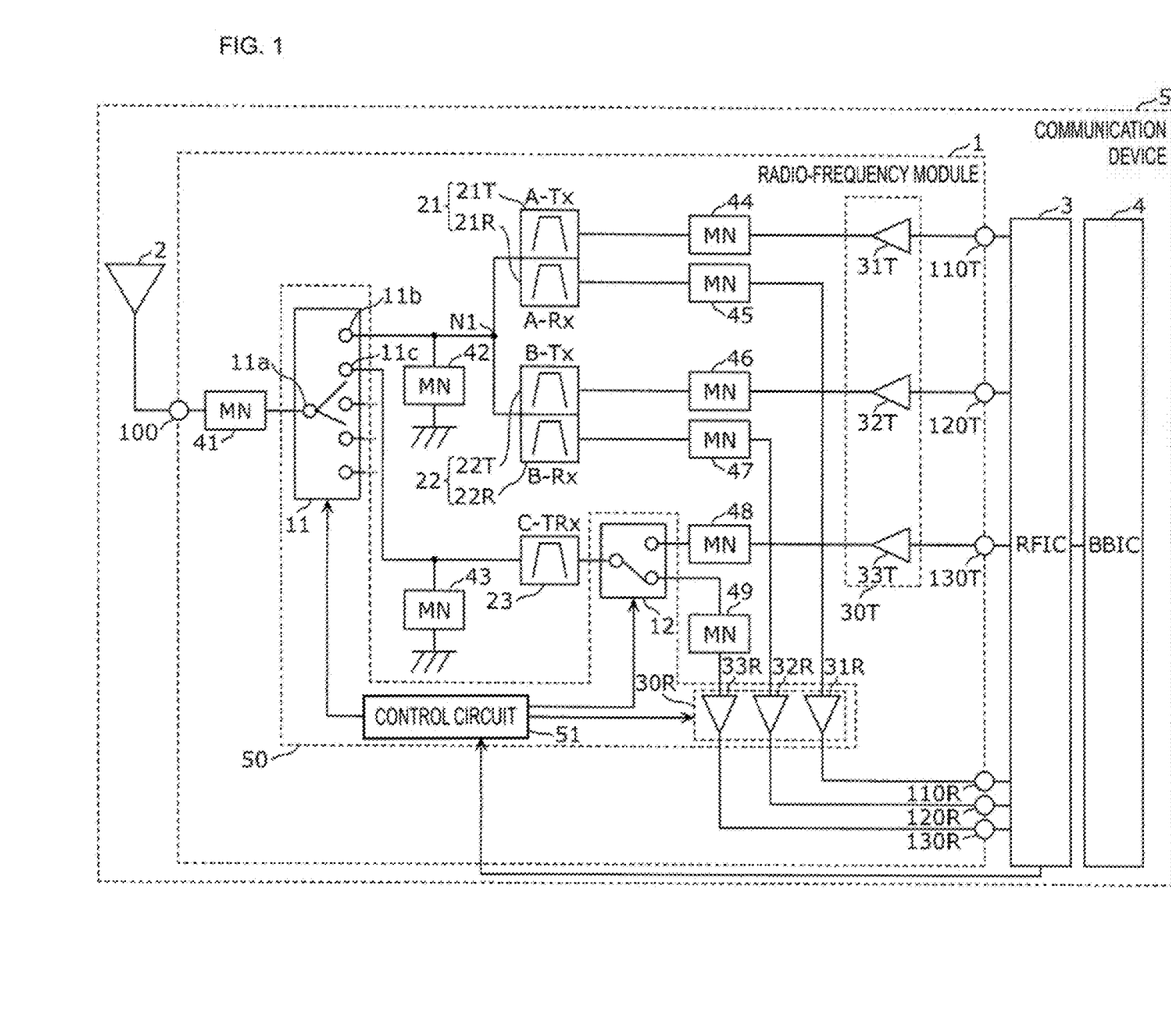
FIG. 1 is a circuit configuration diagram of a radio-frequency module and a communication device according to an embodiment.

FIG. 1 is a circuit configuration diagram of the radio-frequency module 1 and the communication device 5 according to the embodiment. As illustrated in FIG. 1, the communication device 5 includes the radio-frequency module 1, an antenna element 2, a radio-frequency integrated circuit (RFIC) 3, and a baseband integrated circuit (BBIC) 4.

The radio-frequency module 1 communicates a radio-frequency signal between the antenna element 2 and the RFIC 3. The radio-frequency module 1 is a module formed by integrating various functional components used in a front-end circuit for a radio system such as Long Term Evolution (LTE), Wi-Fi (registered trademark), Bluetooth (registered trademark), the Global Positioning System (GPS), or New Radio (NR). The radio-frequency module according to the present disclosure is not limited to these examples.

The RFIC 3 is a radio-frequency integrated circuit that processes a radio-frequency signal received or to be transmitted by the antenna element 2. Specifically, the RFIC 3 processes a radio-frequency signal inputted through a receive signal path of the radio-frequency module 1 by performing, for example, downconversion and outputs the processed receive signal generated by the signal processing to the BBIC 4. The RFIC 3 also processes a transmit signal inputted from the BBIC 4 by upconversion or the like and outputs a radio-frequency transmit signal generated by the signal processing to a transmit signal path of the radio-frequency module 1.

The RFIC 3 has a function of controlling connection between terminals of switches 11 and 12 included in the radio-frequency module 1 in accordance with a communication band (frequency range) in use. The RFIC 3 also has a function of controlling gain of low-noise amplifiers (LNAs) 31R, 32R, and 33R included in the radio-frequency module 1. Specifically, the RFIC 3 outputs signals such as a power supply signal, an IO signal, a clock signal, and a data signal to a control circuit 51 included in a semiconductor integrated circuit (IC) 50 of the radio-frequency module 1. In accordance with these signals, the control circuit 51 outputs control signals to the switches 11 and 12 and the low-noise amplifiers 31R, 32R, and 33R.

The BBIC 4 performs signal processing by using an intermediate frequency range lower than radio-frequency signals communicated in the radio-frequency module 1. The signal processed by the BBIC 4 is used as, for example, an image signal for displaying an image or a sound signal for calls through a speaker.

The antenna element 2 is coupled to a transmit and receive terminal 100 of the radio-frequency module 1. The antenna element 2 radiates a radio-frequency signal outputted from the radio-frequency module 1. The antenna element 2 receives a radio-frequency signal from outside and outputs the radio-frequency signal to the radio-frequency module 1.

The antenna element 2 and the BBIC 4 are non-essential constituent elements for the communication device according to the present disclosure.

Here, details of the configuration of the radio-frequency module 1 are described. In the present embodiment, the radio-frequency module 1 operates as a transceiver circuit for radio-frequency signals.

As illustrated in FIG. 1, the radio-frequency module 1 includes the transmit and receive terminal 100, receive output terminals 110R, 120R, and 130R, transmit input terminals 110T, 120T, and 130T, duplexers 21 and 22, a filter 23, the semiconductor IC 50, matching networks 41, 42, 43, 44, 45, 46, 47, 48, and 49, and a transmit amplifier circuit 30T.

The duplexer 21 is constituted by a transmit filter 21T and a receive filter 21R. The duplexer 21 is an example of a multiplexer. An input end of the transmit filter 21T is coupled to a power amplifier 31T via the matching network 44. An output end of the transmit filter 21T is coupled to a node N1 (first common terminal). An input end of the receive filter 21R is coupled to the node N1 (first common terminal). An output end of the receive filter 21R is coupled to the low-noise amplifier 31R via the matching network 45. The node N1 is coupled to a selection terminal 11b (first selection terminal) of the switch 11 via the matching network 42.

The transmit filter 21T is used for a communication system conforming to Third Generation Partnership Project (3GPP) standards. The transmit filter 21T passes radio-frequency signals in a transmit band corresponding to a communication band A of, for example, LTE or NR. The receive filter 21R is used for a communication system conforming to 3GPP standards. The receive filter 21R passes radio-frequency signals in a receive band corresponding to the communication band A of, for example, LTE or NR. With the configuration described above, the duplexer 21 simultaneously communicates a radio-frequency transmit signal in the communication band A and a radio-frequency receive signal in the communication band A by using frequency division duplex technology.

The transmit filter 21T and the receive filter 21R do not necessarily form a duplexer having a pass band of the transmit band corresponding to the communication band A and a pass band of the receive band corresponding to the same communication band A. The transmit filter 21T and the receive filter 21R may form a multiplexer having pass bands of transmit bands corresponding to different communication bands and pass bands of receive bands corresponding to different communication bands.

The duplexer 22 is constituted by a transmit filter 22T and a receive filter 22R. The duplexer 22 is an example of a multiplexer. An input end of the transmit filter 22T is coupled to a power amplifier 32T via the matching network 46. An output end of the transmit filter 22T is coupled to the node N1 (first common terminal). An input end of the receive filter 22R is coupled to the node N1 (first common terminal). An output end of the receive filter 22R is coupled to the low-noise amplifier 32R via the matching network 47.

The transmit filter 22T is used for a communication system conforming to 3GPP standards. The transmit filter 22T passes radio-frequency signals in a transmit band corresponding to a communication band B of, for example, LTE or NR. The receive filter 22R is used for a communication system conforming to 3GPP standards. The receive filter 22R passes radio-frequency signals in a receive band corresponding to the communication band B of, for example, LTE or NR. With the configuration described above, the duplexer 22 simultaneously communicates a radio-frequency transmit signal in the communication band B and a radio-frequency receive signal in the communication band B by using frequency division duplex technology.

The transmit filter 22T and the receive filter 22R do not necessarily form a duplexer having a pass band of the transmit band corresponding to the communication band B and a pass band of the receive band corresponding to the same communication band B. The transmit filter 22T and the receive filter 22R may form a multiplexer having pass bands of transmit bands corresponding to different communication bands and pass bands of receive bands corresponding to different communication bands.

The filter 23 is an example of a first filter. The filter 23 is implemented as a single filter element including an input end and an output end in a pair. Of the input end and output end in a pair of the filter 23, one end is coupled to a selection terminal 11c (first selection terminal) of the switch 11 via the matching network 43, and the other end is coupled to a common terminal of the switch 12. One selection terminal of the switch 12 is coupled to a power amplifier 33T via the matching network 48. The other selection terminal of the switch 12 is coupled to the low-noise amplifier 33R via the matching network 49.

The filter 23 is used for a communication system conforming to 3GPP standards. The filter 23 passes radio-frequency signals in a transmit and receive band corresponding to a communication band C of, for example, LTE or NR. The switch 12 controls connection of the filter 23 such that (1) the filter 23 functions as a transmit filter configured to pass a radio-frequency transmit signal in the communication band C outputted from the power amplifier 33T and transfer the radio-frequency transmit signal to the antenna element 2 or (2) the filter 23 functions as a receive filter configured to pass a radio-frequency receive signal in the communication band C received by the antenna element 2 and transfer the radio-frequency receive signal to the low-noise amplifier 33R. With the configuration described above, the filter 23 communicates a radio-frequency transmit signal in the communication band C and a radio-frequency receive signal in the communication band C by using time division duplex technology.

The transmit filters 21T and 22T, the receive filters 21R and 22R, and the filter 23 may be, but not limited to, for example, surface acoustic wave filters, acoustic wave filters using a bulk acoustic wave (BAW), LC resonance filters, or dielectric filters.

The transmit amplifier circuit 30T is constituted by the power amplifiers 31T, 32T and 33T.

An input end of the power amplifier 31T is coupled to the RFIC 3 via the transmit input terminal 110T. An output end of the power amplifier 31T is coupled to the input end of the transmit filter 21T via the matching network 44. The power amplifier 31T amplifies radio-frequency signals with priority given to, for example, the communication band A.

An input end of the power amplifier 32T is coupled to the RFIC 3 via the transmit input terminal 120T. An output end of the power amplifier 32T is coupled to the input end of the transmit filter 22T via the matching network 46. The power amplifier 32T amplifies radio-frequency signals with priority given to, for example, the communication band B.

An input end of the power amplifier 33T is coupled to the RFIC 3 via the transmit input terminal 130T. An output end of the power amplifier 33T is coupled to the other end of the filter 23 via the matching network 48 and the switch 12. The power amplifier 33T amplifies radio-frequency signals with priority given to, for example, the communication band C.

The semiconductor IC 50 includes the switches 11 and 12, a receive amplifier circuit 30R, and the control circuit 51.

The receive amplifier circuit 30R is constituted by the low-noise amplifiers 31R, 32R, and 33R.

An input end of the low-noise amplifier 31R is coupled to the output end of the receive filter 21R via the matching network 45. An output end of the low-noise amplifier 31R is coupled to the RFIC 3 via the receive output terminal 110R. The low-noise amplifier 31R amplifies radio-frequency signals with low noise and with priority given to, for example, the communication band A.

An input end of the low-noise amplifier 32R is coupled to the output end of the receive filter 22R via the matching network 47. An output end of the low-noise amplifier 32R is coupled to the RFIC 3 via the receive output terminal 120R. The low-noise amplifier 32R amplifies radio-frequency signals with low noise and with priority given to, for example, the communication band B.

An input end of the low-noise amplifier 33R is coupled to the other end of the filter 23 via the matching network 49 and the switch 12. An output end of the low-noise amplifier 33R is coupled to the RFIC 3 via the receive output terminal 130R. The low-noise amplifier 33R amplifies radio-frequency signals with low noise and with priority given to, for example, the communication band C.

The low-noise amplifiers 31R, 32R, and 33R and the power amplifiers 31T, 32T and 33T each include an amplification element such as a bipolar transistor or field effect transistor; the low-noise amplifiers 31R, 32R, and 33R and the power amplifiers 31T, 32T and 33T are each constituted by, for example, a field effect transistor (FET) made by employing complementary metal-oxide semiconductor (CMOS) technology or made of GaAs or a heterojunction bipolar transistor (HBT).

The switch 11 includes a common terminal 11a (second common terminal) and more than two selection terminals. The common terminal 11a is coupled to the transmit and receive terminal 100 via the matching network 41. The selection terminal 11b (first selection terminal) is coupled to the duplexers 21 and 22 via the matching network 42. The selection terminal 11c (second selection terminal) is coupled to the filter 23 via the matching network 43. The switch 11 is a multi-connection switch configured to concurrently couple the common terminal 11a to the selection terminals 11b and 11c.

The switch 12 includes the common terminal and two selection terminals. The common terminal is coupled to the other end of the filter 23. The one selection terminal of the switch 12 is coupled to the power amplifier 33T via the matching network 48. The other selection terminal of the switch 12 is coupled to the low-noise amplifier 33R via the matching network 49. The switch 12 can exclusively couple the common terminal to the one selection terminal or the other selection terminal.

The control circuit 51 outputs control signals to the switches 11 and 12 and the low-noise amplifiers 31R, 32R, and 33R in accordance with the signals outputted by the RFIC 3, such as a power supply signal, an IO signal, a clock signal, and a data signal.

The semiconductor IC 50 may be formed by employing, for example, CMOS technology. This yields inexpensive manufacturing of the semiconductor IC 50. The semiconductor IC 50 may be made of GaAs. This enables output of radio-frequency signals with high amplification performance and low-noise performance.

The receive amplifier circuit 30R is not necessarily included in the semiconductor IC 50. The transmit amplifier circuit 30T may be included in the semiconductor IC 50.

The matching network 41 is disposed in a path connecting the switch 11 and the transmit and receive terminal 100. The matching network 41 performs impedance matching between the switch 11 and the antenna element 2. The matching network 42 is disposed in a path connecting the switch 11 and the duplexers 21 and 22. The matching network 42 performs impedance matching between the switch 11 and the duplexers 21 and 22. The matching network 43 is disposed in a path connecting the switch 11 and the filter 23. The matching network 43 performs impedance matching between the switch 11 and the filter 23. The matching networks 41 to 43 each include at least one of an inductor and a capacitor.

The matching network 44 is disposed in a path connecting the power amplifier 31T and the transmit filter 21T. The matching network 44 matches the output impedance of the power amplifier 31T with the input impedance of the transmit filter 21T. The matching network 46 is disposed in a path connecting the power amplifier 32T and the transmit filter 22T. The matching network 46 matches the output impedance of the power amplifier 32T with the input impedance of the transmit filter 22T. The matching networks 44 and 46 each include at least one (first matching element) of an inductor and a capacitor.

The matching network 45 is disposed in a path connecting the low-noise amplifier 31R and the receive filter 21R. The matching network 45 matches the input impedance of the low-noise amplifier 31R with the output impedance of the receive filter 21R. The matching network 47 is disposed in a path connecting the low-noise amplifier 32R and the receive filter 22R. The matching network 47 matches the input impedance of the low-noise amplifier 32R with the output impedance of the receive filter 22R. The matching networks 45 and 47 each include at least one (second matching element) of an inductor and a capacitor.

The matching network 48 is disposed in a path connecting the power amplifier 33T and the switch 12. The matching network 48 matches the output impedance of the power amplifier 33T with the input impedance of the filter 23. The matching network 49 is disposed in a path connecting the low-noise amplifier 33R and the switch 12. The matching network 49 matches the input impedance of the low-noise amplifier 33R with the output impedance of the filter 23.

The matching networks 41 to 49 may be each disposed in series in the corresponding path connecting two circuit elements or disposed between a node in the corresponding path and the ground. The matching networks 41 to 49 are not necessarily provided.

With the circuit configuration of the radio-frequency module 1 and the communication device 5, radio-frequency signals in the communication band A, B, or C can be transmitted and received. In addition, the multi-connection switch 11 simultaneously enables two or more kinds of (1) transmission and reception of radio-frequency signals in the communication band A, (2) transmission and reception of radio-frequency signals in the communication band B, and (3) transmission or reception of radio-frequency signals in the communication band C.

It should be noted that the radio-frequency module according to the present disclosure can include only the duplexer 21 or 22 out of the constituent elements of the radio-frequency module 1 according to the embodiment. Thus, the radio-frequency module according to the present disclosure can communicate radio-frequency signals in at least one communication band.

In the radio-frequency module 1 and the communication device 5 according to the present embodiment, the communication bands A and B each may be LTE Band 25 (transmit band: 1850-1915 MHz; receive band: 1930-1995 MHz), Band 30 (transmit band: 2305-2315 MHz; receive band: 2350-2360 MHz), or Band 66 (transmit band: 1710-1780 MHz; receive band: 2110-2200 MHz); the communication band C may be LTE Band 34 (transmit and receive band: 2010-2025 MHz), Band 39 (transmit and receive band: 1880-1920 MHz), or Band 41 (transmit and receive band: 2496-2690 MHz).

When the total of the interconnection length from the transmit filter 21T of the duplexer 21 (or 22) to the node N1 (first common terminal), which constitute the radio-frequency module 1, and the interconnection length from the receive filter 21R to the node N1 (first common terminal), which constitute the radio-frequency module 1, is relatively long, interconnect resistance due to these interconnections and phase shifts cause increased signal communication loss. If the total of the interconnection lengths is shortened to reduce signal communication loss, the transmit filter 21T and the receive filter 21 R are positioned in close proximity to each other at the same major surface, which worsens isolation between transmit signals and receive signals.

In this regard, the radio-frequency module 1 according to the present embodiment has a configuration that achieves both shortened interconnection lengths and suppressed degradation of isolation between transmit signals and receive signals. The following is a description of a configuration of the radio-frequency module 1 that can achieve reduced signal communication loss, reduced size, and improved isolation between transmit signals and receive signals.

[2 Arrangement of Circuit Elements of Radio-Frequency Module 1]

Next, an arrangement of circuit elements of the radio-frequency module 1 will be specifically described with reference to FIGS. 2 and 3.

Figure 2:
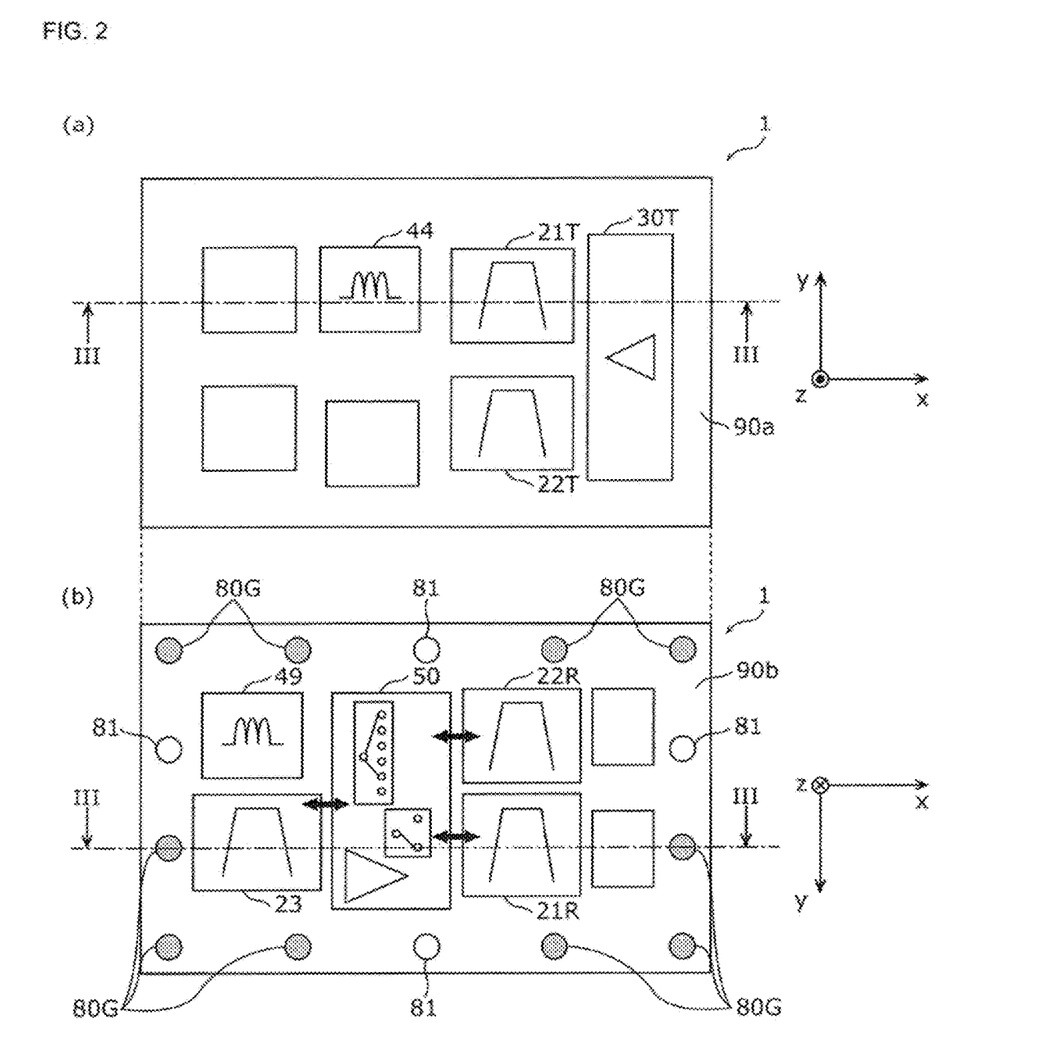
FIG. 2 provides a plan view and a bottom view of the radio-frequency module according to the embodiment.

FIG. 2 provides a plan view (FIG. 2(a)) and a bottom view (FIG. 2(b)) of the radio-frequency module 1 according to the embodiment. FIG. 3 is a sectional view of the radio-frequency module 1 according to the embodiment.

Figure 3:
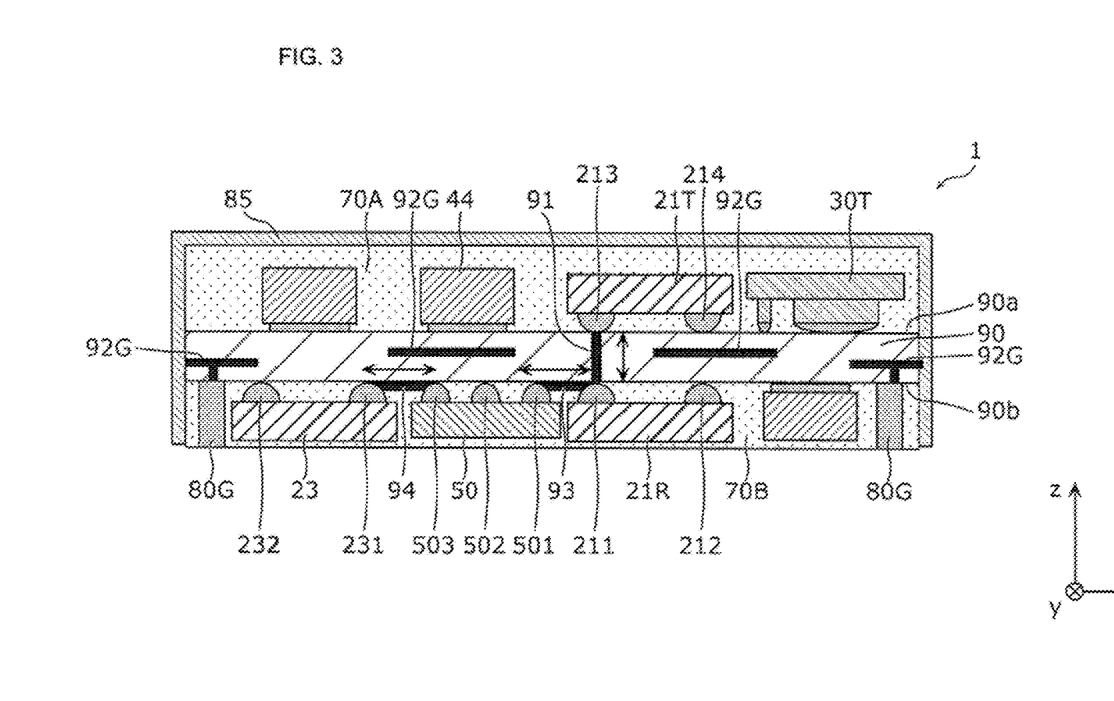
FIG. 3 is a sectional view of the radio-frequency module according to the embodiment.

Specifically, FIG. 3 is a sectional view taken along line III-III in FIG. 2.

It should be noted that FIG. 2 does not illustrate resin members 70A and 70B and a shield electrode layer 85. In FIG. 2(a), to differently illustrate input-output terminals 81 and ground terminals 80G, the ground terminals 80G are illustrated with hatching. FIG. 2 does not illustrate wirings connecting circuit elements at a major surface 90a and wirings connecting circuit elements at a major surface 90b. FIG. 3 does not illustrate planar wiring patterns in a mounting board 90 except a ground electrode layer 92G.

As illustrated in FIGS. 2 and 3, the radio-frequency module 1 includes, in addition to the circuit elements illustrated in FIG. 1, the mounting board 90, the input-output terminals 81, the ground terminals 80G, the resin members 70A and 70B, and the shield electrode layer 85.

The mounting board 90 may be, for example, a printed circuit board (PCB), a low temperature co-fired ceramics (LTCC) substrate, or a resin multilayer substrate. In the present embodiment, the mounting board 90 is rectangular in plan view as illustrated in FIG. 2, but this should not be construed in a limiting sense.

The mounting board 90 has the major surfaces 90a and 90b, which are opposite to each other. The major surface 90a is an example of a first major surface. The major surface 90a may be referred to as a front surface or top surface. The major surface 90b is an example of a second major surface. The major surface 90b may be referred to as a back surface or bottom surface.

In the radio-frequency module 1 according to the present embodiment, the transmit filter 21T is disposed on the major surface 90a, and the receive filter 21R is disposed on the major surface 90b, as illustrated in FIGS. 2 and 3. The transmit filter 21T and the receive filter 21R at least partially coincide with each other when viewed in a plan view. Otherwise stated, a footprint of the transmit filter 21T and a footprint of the receive filter 21R at least partially overlap when the mounting board 90 is viewed in the plan view. Specifically, the transmit filter 21T is coupled to the mounting board 90 with the bump electrodes 213 and 214 interposed therebetween as illustrated in FIG. 3. The receive filter 21R is coupled to the mounting board 90 with the bump electrodes 211 and 212 interposed therebetween as illustrated in FIG. 3. A via-conductor 91, which is elongated in the Z-axis direction of the mounting board 90, couples the bump electrodes 213 and 211 to each other as illustrated in FIG. 3. The bump electrode 213 of the transmit filter 21T corresponds to the output end of the transmit filter 21T. The bump electrode 211 of the receive filter 21R corresponds to the input end of the receive filter 21R and the node N1.

In the embodiment, the thickness of the mounting board 90 may be, for example, 150 μm; the smallest value of substrate gaps on the major surface 90a or 90b of the mounting board 90 (narrowest gap between circuit elements adjacent to each other on an identical major surface) may be, for example, 80 μm.

Because the transmit filter 21T and the receive filter 21R coincide with each other in a plan view, the configuration described above can shorten the total of the interconnection length from the node N1 (the bump electrode 211) to the output end of the transmit filter 21T (the bump electrode 213) and the interconnection length from the node N1 (the bump electrode 211) to the input end of the receive filter 21R (the bump electrode 211), which is substantially zero. As a result, it is possible to reduce signal communication loss at the duplexer 21 caused by interconnect resistance and phase shifts. Moreover, because the mounting board 90 is interposed between the transmit filter 21T and the receive filter 21R, it is possible to improve isolation between transmit signals and receive signals. Consequently, it is possible to reduce signal communication loss at the radio-frequency module 1 and also improve isolation between transmission and reception.

In the radio-frequency module 1 according to the present embodiment, the transmit filter 22T is disposed on the major surface 90a, and the receive filter 22R is disposed on the major surface 90b, as illustrated in FIG. 2. The transmit filter 22T and the receive filter 22R at least partially coincide with each other when viewed in a plan view. Otherwise stated, a footprint of the transmit filter 22T and a footprint of the receive filter 22R at least partially overlap when the mounting board 90 is viewed in the plan view. Specifically, the transmit filter 22T is coupled to the mounting board 90 with bump electrodes interposed therebetween, which is not illustrated in FIGS. 2 and 3. The receive filter 22R is coupled to the mounting board 90 with bump electrodes interposed therebetween. A via-conductor elongated in the Z-axis direction of the mounting board 90 couples one bump electrode of the transmit filter 22T and one bump electrode of the receive filter 22R. The one bump electrode of the transmit filter 22T corresponds to the output end of the transmit filter 22T. The one bump electrode of the receive filter 22R corresponds to the input end of the receive filter 22R and the node N1.

Because the transmit filter 22T and the receive filter 22R coincide with each other in a plan view, the configuration described above can shorten the total of the interconnection length from the node N1 (the one bump electrode of the receive filter 22R) to the output end of the transmit filter 21T (the one bump electrode of the transmit filter 22T) and the interconnection length from the node N1 (the one bump electrode of the receive filter 22R) to the input end of the receive filter 21R (the one bump electrode of the receive filter 22R), which is substantially zero. As a result, it is possible to reduce signal communication loss at the duplexer 22 caused by interconnect resistance and phase shifts. Moreover, because the mounting board 90 is interposed between the transmit filter 22T and the receive filter 22R, it is possible to improve isolation between transmit signals and receive signals. Consequently, it is possible to reduce signal communication loss at the radio-frequency module 1 and also improve isolation between transmission and reception.

Only one of the positional relationship between the transmit filter 21T and the receive filter 21R and the positional relationship between the transmit filter 22T and the receive filter 22R may be established.

In the present embodiment, the transmit filters 21T and 22T, the matching network 44, and the transmit amplifier circuit 30T are mounted on the major surface 90a, and the receive filters 21R and 22R, the filter 23, the semiconductor IC 50, and the matching network 49 are mounted on the major surface 90b, as illustrated in FIG. 2.

This means that the semiconductor IC 50 and the filter 23 are mounted on the same major surface 90b. The switch 11 and the filter 23 are mounted on the same major surface 90b. Specifically, the semiconductor IC 50 is coupled to the mounting board 90 with the bump electrodes 501, 502, and 503 interposed therebetween. The filter 23 is coupled to the mounting board 90 with bump electrodes 231 and 232 interposed therebetween. A wiring 93, which is formed at the major surface 90b of the mounting board 90, couples the bump electrodes 501 and 211. A wiring 94, which is formed at the major surface 90b of the mounting board 90, couples the bump electrodes 503 and 231. The wirings 93 and 94 are planar wiring patterns extended along the major surface of the mounting board 90. The bump electrode 501 of the semiconductor IC 50 corresponds to the selection terminal 11b of the switch 11. The bump electrode 503 of the semiconductor IC 50 corresponds to the selection terminal 11c of the switch 11.

The configuration described above enables the node N1 (the bump electrode 211 of the receive filter 21R), the selection terminals 11b (the bump electrode 501) and 11c (the bump electrode 503) of the switch 11, and one end (the bump electrode 231) of the filter 23 to be mounted on the identical major surface 90b of the mounting board 90, and as a result, these elements can be positioned in close proximity to each other. This consequently shortens the total of the interconnection length from the selection terminal 11b of the switch 11 to a common terminal (the node N1) of the duplexer 21 and the interconnection length from the selection terminal 11c of the switch 11 to the one end of the filter 23. As a result, it is possible to reduce signal communication loss caused by interconnect resistance and phase shifts when at least one of transmission and reception of radio-frequency signals passing through the duplexer 21 and at least one of transmission and reception of radio-frequency signals passing through the filter 23 are simultaneously performed.

In the configuration described above, the semiconductor IC 50 is mounted on the major surface 90b, and the transmit filter 21T is mounted on the major surface 90a. In this configuration, the transmit filter 21T, which is configured to transfer high-power transmit signals, is not mounted on the major surface 90b with the switch 11 and the filter 23, and as a result, it is possible to hinder malfunction of the switch 11 due to the transmit signals and suppress decrease in receive sensitivity of receive signals communicated through the filter 23.

When the switch 11 is mounted on the major surface 90b, the switch 11 is not necessarily integrated in the semiconductor IC 50 but may be solely mounted on the major surface 90b the switch 11.

The switch 11 and the filter 23 may be mounted on the same major surface 90a. In this case, the bump electrode 213 of the transmit filter 21T corresponds to the node N1; a planar wiring pattern formed at the major surface 90a couples the bump electrode 213 and the bump electrode 501 (corresponding to the selection terminal 11b) of the semiconductor IC 50; a planar wiring pattern formed at the major surface 90a couples the bump electrode 503 (corresponding to the selection terminal 11c) of the semiconductor IC 50 and the bump electrode 231 of the filter 23.

The configuration described above enables the node N1 (the bump electrode 213 of the transmit filter 21T), the selection terminals 11b (the bump electrode 501) and 11c (the bump electrode 503) of the switch 11, and one end (the bump electrode 231) of the filter 23 to be mounted on the identical major surface of the mounting board 90, and as a result, these elements can be positioned in close proximity to each other. This consequently shortens the total of the interconnection length from the selection terminal 11b of the switch 11 to a common terminal (the node N1) of the duplexer 21 and the interconnection length from the selection terminal 11c of the switch 11 to the one end of the filter 23. As a result, it is possible to reduce signal communication loss caused by interconnect resistance and phase shifts when at least one of transmission and reception of radio-frequency signals passing through the duplexer 21 and at least one of transmission and reception of radio-frequency signals passing through the filter 23 are simultaneously performed.

The bump electrodes 211, 212, 213, 214, 231, 232, 501, 502, and 503 are ball-like electrodes made of a high-conductivity metal such as solder bumps made of Sn/Ag/Cu or bumps mainly made of Au. The bump electrodes 211 to 214, 231, 232, and 501 to 503 are not necessarily bump electrodes but may be, for example, electrodes made of a solder paste.

The matching network 44 is mounted on the major surface 90a. The matching network 49 is mounted on the major surface 90b. With the configuration, the mounting board 90 is interposed between an inductor constituting the matching network 44 and an inductor constituting the matching network 49, and thus, it is possible to hinder magnetic-field coupling between the two inductors. This also prevents radio-frequency transmit signals outputted from the power amplifier 31T from entering the low-noise amplifier 33R by the magnetic-field coupling without traveling through the transmit filter 21T and the filter 23, and as a result, it is possible to suppress degradation of receive sensitivity of radio-frequency signals in the communication band C.

At least one of the matching networks 44 and 46 may be mounted on the major surface 90a, and at least one of the matching networks 45 and 47 may be mounted on the major surface 90b. In this case, the mounting board 90 is interposed between an inductor (first matching element) constituting the at least one of the matching networks 44 and 46 and an inductor (second matching element) constituting the at least one of the matching networks 45 and 47, and thus, it is possible to hinder magnetic-field coupling between the two inductors. This prevents radio-frequency transmit signals outputted from the power amplifier 31T or 32T from entering the low-noise amplifier 31R or 32R by the magnetic-field coupling without travelling through the transmit filter 21T or 22T and the receive filter 21R or 22R, and as a result, it is possible to suppress degradation of receive sensitivity of radio-frequency signals in the communication band A or B.

The mounting board 90 includes the ground electrode layer 92G as illustrated in FIG. 3. The ground electrode layer 92G is formed by planar wiring patterns extending along the major surface of the mounting board 90. The transmit filter 21T and the receive filter 21R may at least partially coincide with the ground electrode layer 92G when viewed in a plan view. Otherwise stated, the footprint of the transmit filter 21T and the footprint of the receive filter 21R at least partially overlap with the ground electrode layer 92G when the mounting board 90 is viewed in a plan view. The transmit filter 22T and the receive filter 22R may at least partially coincide with the ground electrode layer 92G when viewed in a plan view. Otherwise stated, the footprint of the transmit filter 22T and the footprint of the receive filter 22R at least partially overlap with the ground electrode layer 92G when the mounting board 90 is viewed in a plan view.

The resin member 70A is formed on the major surface 90a to cover the transmit filters 21T and 22T, the matching network 44, and the transmit amplifier circuit 30T. The resin member 70A has a functionality of securing reliability of the transmit filters 21T and 22T, the matching network 44, and the transmit amplifier circuit 30T with regard to, for example, mechanical strength and moisture resistance. The resin member 70A does not necessarily cover all the transmit filters 21T and 22T, the matching network 44, and the transmit amplifier circuit 30T. For example, the resin member 70A may cover only side surfaces of the transmit amplifier circuit 30T.

The resin member 70B is formed on the major surface 90b to cover the receive filters 21R and 22R, the filter 23, the semiconductor IC 50, and the matching network 49. The resin member 70B has a functionality of securing reliability of the receive filters 21R and 22R, the filter 23, the semiconductor IC 50, and the matching network 49 with regard to, for example, mechanical strength and moisture resistance. The resin member 70B does not necessarily cover all surfaces of the receive filters 21R and 22R, the filter 23, the semiconductor IC 50, and the matching network 49. For example, the resin member 70B may cover only side surfaces of the semiconductor IC 50.

The input-output terminals 81 are all used to communicate electrical signals with, for example, an external substrate (not illustrated in the drawing). The input-output terminals 81, which may be, for example, columnar copper electrodes elongated from the major surface 90b of the mounting board 90 in the Z direction, penetrate the resin member 70B to couple the mounting board 90 and the external substrate. The external substrate may be, for example, a mother substrate positioned in the reverse direction of the Z axis of the radio-frequency module 1. The input-output terminals 81 each correspond to, for example, any of the transmit and receive terminal 100, the receive output terminals 110R, 120R, and 130R, the transmit input terminals 110T, 120T, and 130T illustrated in FIG. 1.

The ground terminals 80G are an example of a plurality of external connection terminals disposed on the major surface 90b of the mounting board 90 and set at a ground potential. The ground terminals 80G, which may be, for example, columnar copper electrodes elongated from the major surface 90b of the mounting board 90 in the Z direction, penetrate the resin member 70B to couple the mounting board 90 and the external substrate.

The input-output terminals 81 and the ground terminals 80G are not necessarily formed in a columnar shape and not necessarily made of copper; the shape and material are not limited to this example. For example, the input-output terminals 81 and the ground terminals 80G may be hemispherical electrodes (bumps), such as solder balls or copper core balls.

The shield electrode layer 85 covers a front surface and side surfaces of the resin member 70A and side surfaces of the resin member 70B. The shield electrode layer 85 is coupled to the ground electrode layer 92G. For example, the shield electrode layer 85 is coupled to the ground electrode layer 92G at side surfaces of the mounting board 90.

The resin members 70A and 70B, the shield electrode layer 85, the input-output terminals 81, and the ground terminals 80G are non-essential constituent elements for the radio-frequency module 1 according to the present disclosure. The input-output terminals 81 are not necessarily provided at the major surface 90b and may be replaced with, for example, bonding wires.

[3 Effects]

As described above, in the present embodiment, the radio-frequency module 1 includes the mounting board 90 having the major surfaces 90a and 90b opposite to each other and also includes the duplexer 21 including the transmit filter 21T coupled to the node N1 and the receive filter 21R coupled to the node N1. The transmit filter 21T is mounted on the major surface 90a, and the receive filter 21R is mounted on the major surface 90b. When the mounting board 90 is viewed in a plan view, the transmit filter 21T and the receive filter 21R can at least partially coincide with each other.

As such, the transmit filter 21T and the receive filter 21R coincide with each other when viewed in a plan view. This can shorten the total of the interconnection length from the node N1 to the transmit filter 21T and the interconnection length from the node N1 to the receive filter 21R, and as a result, it is possible to reduce signal communication loss at the duplexer 21 caused by interconnect resistance and phase shifts. Moreover, because the mounting board 90 is interposed between the transmit filter 21T and the receive filter 21R, it is possible to improve isolation between transmit signals and receive signals. Consequently, it is possible to reduce signal communication loss at the radio-frequency module 1 and also improve isolation between transmission and reception.

In the present embodiment, the radio-frequency module 1 further includes the common terminal 11a and the selection terminals 11b and 11c. The radio-frequency module 1 further includes the switch 11, which is capable of simultaneously coupling the common terminal 11a to the selection terminals 11b and 11c. The radio-frequency module 1 further includes the filter 23 coupled to the selection terminal 11c. The node N1 can be coupled to the selection terminal 11b.

With this configuration, at least one of transmission and reception of radio-frequency signals passing through the duplexer 21 and at least one of transmission and reception of radio-frequency signals passing through the filter 23 can be simultaneously performed.

In the present embodiment, the switch 11 and the filter 23 may be mounted on the identical major surface of the major surfaces 90a and 90b.

This shortens the interconnection length from the switch 11 to the filter 23. Additionally, because one of the transmit filter 21T and the receive filter 21R is disposed on the identical major surface as the switch 11, the interconnection length from the switch 11 to the node N1 is also relatively short. As a result, it is possible to reduce signal communication loss caused by interconnect resistance and phase shifts when at least one of transmission and reception of radio-frequency signals passing through the duplexer 21 and at least one of transmission and reception of radio-frequency signals passing through the filter 23 are simultaneously performed.

In the present embodiment, the switch 11 and the filter 23 may be mounted on the major surface 90b.

In this configuration, the transmit filter 21T, which is configured to transfer high-power transmit signals, is not mounted on the major surface 90b with the switch 11 and the filter 23, and as a result, it is possible to hinder malfunction of the switch 11 due to the transmit signals and suppress decrease in receive sensitivity of receive signals communicated through the filter 23.

In the present embodiment, the radio-frequency module 1 has the semiconductor IC 50 including the switch 11 and the control circuit 51 configured to output to the switch 11 a control signal for controlling connection of the switch 11. The semiconductor IC 50 may be mounted on the major surface 90b.

In this configuration, the transmit filter 21T, which is configured to transfer high-power transmit signals, is not mounted on the major surface 90b with the semiconductor IC 50, and as a result, it is possible to hinder malfunction of the switch 11 caused by noise of the transmit signals added to the control signal described above.

In the present embodiment, the semiconductor IC 50 may further include the low-noise amplifier 31R configured to amplify a radio-frequency receive signal outputted from the receive filter 21R.

In this configuration, because the receive filter 21R is mounted on the major surface 90b with the semiconductor IC 50, the interconnection length from the receive filter 21R to the low-noise amplifier 31R is consequently shortened, which reduces communication loss of receive signals.

The present embodiment further includes the matching network 44, which is configured to perform impedance matching between the transmit filter 21T and the power amplifier 31T disposed on the input end side with respect to the transmit filter, and the matching network 45, which is configured to perform impedance matching between the low-noise amplifier 31R and the receive filter 21R. The first matching element constituting the matching network 44 may be mounted on the major surface 90a. The second matching element constituting the matching network 45 may be mounted on the major surface 90b.

In this configuration, the mounting board 90 is interposed between the first matching element and the second matching element, and as a result, it is possible to hinder magnetic-field coupling between the first matching element and the second matching element. This also prevents radio-frequency transmit signals outputted from the power amplifier 31T from entering the low-noise amplifier 31R by the magnetic-field coupling without traveling through the transmit filter 21T and the receive filter 21R, and as a result, it is possible to suppress degradation of receive sensitivity.

In the present embodiment, the mounting board 90 includes the ground electrode layer 92G formed by planar wiring patterns. The transmit filter 21T and the receive filter 21R at least partially coincide with the ground electrode layer 92G when viewed in a plan view.

In this configuration, the ground electrode layer 92G is interposed between the transmit filter 21T and the receive filter 21R, and consequently, isolation between transmit signals and receive signals can be strengthened.

In the present embodiment, the communication device 5 can include the radio-frequency integrated circuit (RFIC) 3 configured to process a radio-frequency signal received or to be transmitted by the antenna element 2 and also include the radio-frequency module 1 configured to communicate the radio-frequency signal between the antenna element 2 and the RFIC 3.

This configuration yields the communication device 5 with reduced signal communication loss and improved isolation between transmission and reception.

(Other Modifications)

Although the radio-frequency module and communication device according to the present disclosure have been described above by using the embodiment, the radio-frequency module and communication device according to the present disclosure are not limited to the embodiment described above. The present disclosure also embraces other embodiments implemented as any combination of the constituent elements of the embodiment, other modified examples obtained by making various modifications that occur to those skilled in the art without departing from the scope of the embodiment described above, and various hardware devices including the radio-frequency module and communication device.

For example, in the radio-frequency module and communication device according to the embodiment described above, another circuit element, wiring, and the like may also be inserted in paths connecting any of the circuit components and signal paths that are illustrated in the drawings.

INDUSTRIAL APPLICABILITY

The present disclosure can be used as a radio-frequency module provided at the front-end for a wide variety of communication devices such as a mobile phone.

The invention claimed is:

1. A radio-frequency module comprising:
a mounting board having a first major surface and a second major surface on opposite sides of the mounting board; and
a multiplexer including a first common terminal, a transmit filter coupled to the first common terminal, and a receive filter coupled to the first common terminal, wherein
the mounting board includes a ground electrode layer formed by a planar wiring pattern,
the transmit filter is mounted on the first major surface of the mounting board,
the receive filter is mounted on the second major surface of the mounting board,
the mounting board is interposed between the transmit filter and the receive filter, and
when the mounting board is viewed in a plan view
a footprint of the transmit filter at least partially overlaps a footprint of the receive filter, and
the footprint of the transmit filter and the footprint of the receive filter at least partially overlap with the ground electrode layer of the mounting board interposed between the transmit filter and the receive filter.

2. The radio-frequency module of claim 1, further comprising:
a switch including a second common terminal, a first selection terminal, and a second selection terminal, the switch being configured to concurrently couple the second common terminal to the first selection terminal and the second selection terminal.

3. The radio-frequency module of claim 2, further comprising:
a first filter coupled to the second selection terminal, wherein
the first common terminal is coupled to the first selection terminal.

4. The radio-frequency module of claim 3, wherein
the switch and the first filter are mounted on a same major surface of the first major surface and the second major surface.

5. The radio-frequency module of claim 4, wherein
the switch and the first filter are mounted on the second major surface.

6. The radio-frequency module of claim 5, further comprising:
a semiconductor integrated circuit (IC) including the switch and a control circuit configured to output to the switch a control signal for controlling connection of the switch.

7. The radio-frequency module of claim 6, wherein
the semiconductor IC is mounted on the second major surface.

8. The radio-frequency module of claim 7, wherein
the semiconductor IC further includes a low-noise amplifier configured to amplify a radio-frequency receive signal output from the receive filter.

9. The radio-frequency module of claim 8, further comprising:
a first matching element configured to perform impedance matching between the transmit filter and a power amplifier disposed on an input end side with respect to the transmit filter; and
a second matching element configured to perform impedance matching between the low-noise amplifier and the receive filter.

10. The radio-frequency module of claim 9, wherein
the first matching element is mounted on the first major surface, and
the second matching element is mounted on the second major surface.

11. A communication device comprising:
a radio-frequency integrated circuit configured to process a radio-frequency signal received or to be transmitted by an antenna element; and
a radio-frequency module configured to communicate the radio-frequency signal between the antenna element and the radio-frequency integrated circuit, wherein the radio frequency module comprises
- a mounting board having a first major surface and a second major surface on opposite sides of the mounting board; and
- a multiplexer including a first common terminal, a transmit filter coupled to the first common terminal, and a receive filter coupled to the first common terminal, wherein the mounting board includes a ground electrode layer formed by a planar wiring pattern, the transmit filter is mounted on the first major surface of the mounting board, the receive filter is mounted on the second major surface of the mounting board, the mounting board is interposed between the transmit filter and the receive filter, and when the mounting board is viewed in a plan view
- a footprint of the transmit filter at least partially overlaps a footprint of the receive filter, and
- the footprint of the transmit filter and the footprint of the receive filter at least partially overlap with the ground electrode layer of the mounting board interposed between the transmit filter and the receive filter.

12. A radio-frequency module comprising:
- a mounting board having a first surface and a second surface on opposite sides of the mounting board; and
- a multiplexer comprising
- a first common terminal;
- a first filter (Tx) mounted on the first surface of the mounting board and connected to the first common terminal; and
- a second filter (Rx) mounted on the second major surface of the mounting board and connected to the first common terminal, wherein the mounting board is interposed between the first filter and the second filter, the mounting board includes a ground electrode layer formed by a planar wiring pattern, and in a plan view of the mounting board
- a footprint of the first filter at least partially overlaps a footprint of the second filter, and
- the footprint of the first filter and the footprint of the second filter at least partially overlap with the ground electrode layer of the mounting board interposed between the first filter and the second filter.

13. The radio-frequency module of claim 12, further comprising:
- a via-conductor configured to connect the first filter to the common terminal through the mounting board.

14. The radio-frequency module of claim 12, further comprising:
- a switch including a second common terminal, a first selection terminal, and a second selection terminal, wherein the switch is configured to concurrently couple the second common terminal to the first selection terminal and the second selection terminal.

15. The radio-frequency module of claim 14, further comprising:
- a third filter coupled to the second selection terminal, wherein the first common terminal is coupled to the first selection terminal, and the switch and the third filter are mounted on the second surface.

16. The radio frequency module of claim 14, further comprising:
- a semiconductor integrated circuit (IC) mounted on the second surface, wherein the semiconductor IC includes the switch and a control circuit configured to output to the switch a control signal for controlling connection of the switch.

17. The radio frequency module of claim 12, wherein the mounting board includes a ground electrode layer formed by a planar wiring pattern, and in a plan view of the mounting board, the footprint of the first filter and a footprint of the second filter at least partially overlap with the ground electrode layer.

18. The radio frequency module of claim 12, further comprising:
- a first matching element mounted on the first surface and configured to perform impedance matching between the first filter and a power amplifier disposed on an input end side with respect to the first filter; and
- a second matching element mounted on the second surface and configured to perform impedance matching between a low-noise amplifier and the second filter.

\* \* \* \* \*